(12) United States Patent
Todoroki

(10) Patent No.: US 8,159,249 B2
(45) Date of Patent: Apr. 17, 2012

(54) INSPECTION UNIT

(75) Inventor: Takeshi Todoroki, Tokyo (JP)

(73) Assignee: Yokowo Co., Ltd., Tokyo (JP)

( * ) Notice: Subject to any disclaimer, the term of this patent is extended or adjusted under 35 U.S.C. 154(b) by 21 days.

(21) Appl. No.: 12/553,386

(22) Filed: Sep. 3, 2009

(65) Prior Publication Data

US 2010/0066394 A1    Mar. 18, 2010

(30) Foreign Application Priority Data

Sep. 5, 2008 (JP) .............................. P. 2008-229119

(51) Int. Cl.
*G01R 31/00* (2006.01)
(52) U.S. Cl. .......... 324/755.05; 324/754.03; 324/754.14
(58) Field of Classification Search .................. 324/761, 324/754.01–754.03, 754.14, 755.01–755.02, 324/755.05, 756.01–756.04, 762.01; 439/55–85
See application file for complete search history.

(56) References Cited

U.S. PATENT DOCUMENTS

| | | | | |
|---|---|---|---|---|
| 5,200,695 A * | 4/1993 | Kazama | ................... | 324/755.05 |
| 6,462,567 B1 * | 10/2002 | Vinther et al. | ........... | 324/754.14 |
| 7,154,286 B1 * | 12/2006 | Marx et al. | ............... | 324/755.05 |
| 7,626,408 B1 * | 12/2009 | Kaashoek | ...................... | 324/761 |
| 2003/0190825 A1 * | 10/2003 | Sasaki | .............. | 439/66 |
| 2005/0280433 A1 * | 12/2005 | Nelson et al. | .................. | 324/761 |
| 2006/0066330 A1 | 3/2006 | Yoshida | | |
| 2007/0001695 A1 * | 1/2007 | Marx et al. | ..................... | 324/761 |
| 2007/0018667 A1 * | 1/2007 | Kinoshita | ..................... | 324/761 |
| 2008/0048702 A1 * | 2/2008 | Nagata | ......................... | 324/761 |
| 2008/0088331 A1 * | 4/2008 | Yoshida | ......................... | 324/761 |
| 2009/0009205 A1 * | 1/2009 | Kazama | ....................... | 324/761 |

FOREIGN PATENT DOCUMENTS

JP        2006-98375        4/2006

* cited by examiner

*Primary Examiner* — Roberto Velez
*Assistant Examiner* — Arleen M Vazquez
(74) *Attorney, Agent, or Firm* — Morgan, Lewis & Bockius LLP

(57) ABSTRACT

An inspection unit includes: a metal block having a through hole; a contact probe for grounding which is coaxially arranged in through hole; and a coil spring having electrical conductivity at least on a surface thereof and provided between an inner peripheral face of the through hole and an outer peripheral face of the contact probe. The coil spring includes: a first coil part a part of which is in contact with the inner peripheral face of the through hole; and a second coil part a part of which is in contact with the outer peripheral face of the contact probe.

10 Claims, 7 Drawing Sheets

FIG 11 (A) RELATED ART
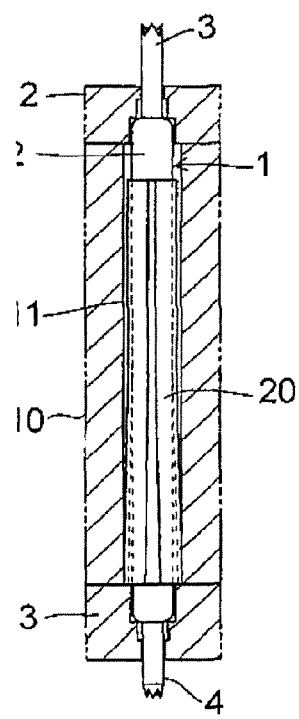
FIG. 11 (B) RELATED ART
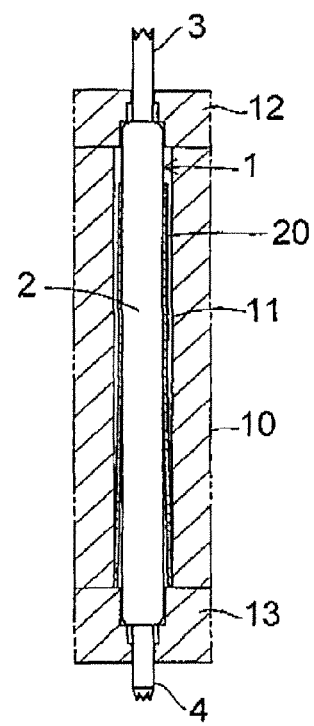
FIG. 11 (C) RELATED ART
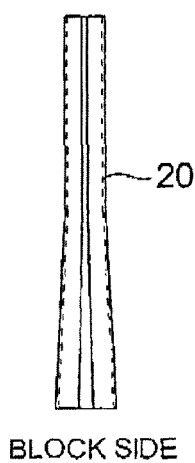

INSPECTION UNIT

BACKGROUND OF THE INVENTION

The present invention relates to an inspection unit to be employed for inspecting an electronic component to be inspected such as a semiconductor integrated circuit, and more particularly, to a connecting structure between a contact probe for grounding and a metal block in the inspection unit which has the contact probe for grounding.

In order to inspect an electronic component to be inspected such as a semiconductor integrated circuit, there has been employed an inspection unit (socket) having a number of contact probes which are brought into contact with electrodes of the electronic component to be inspected. In the inspection unit dealing with high frequency, contact probes for high frequency signal, contact probes for power supply, and contact probes for grounding (GND) are arranged passing through respective through holes in a metal block, for the purpose of preventing influence of noises.

An example of the inspection unit of this type is disclosed in JP-A-2006-98375.

FIGS. 11(A) and 11(B) show a part where a contact probe for grounding is mounted in an inspection unit of the related art, and FIG. 11(C) shows a ground tube which connects the contact probe for grounding to a metal block.

As shown in FIGS. 11(A) and 11(B), a contact probe 1 for grounding is an electrically conductive structure including a conductive tube 2 in a cylindrical shape, and conductive plungers 3, 4 which are urged so as to be projected from the conductive tube 2 by a spring incorporated therein, and is so arranged as to pass through a through hole 11 in a metal block 10. The contact probe 1 for grounding is coaxially held with respect to an inner peripheral face of the through hole 11, by means of retainers (fixing means of insulating substance) 12, 13 which are fixed to upper and lower faces of the metal block 10.

Connection between the contact probe for grounding and the metal block is conducted by using a ground tube 20, as shown in FIG. 11(C). The ground tube 20 is produced by folding a metal plate into a tubular shape. One end of the ground tube 20 is folded so as to have a slightly smaller inner diameter than an outer diameter of the probe 1 for grounding so that the ground tube 20 can be contacted with an outer peripheral face of the probe 1, and the other end is enlarged so that the ground tube 20 can be contacted with the inner peripheral face of the through hole 11. This ground tube 20 is provided in a gap between the probe 1 and the metal block 10 thereby to achieve electrical connection between them.

Although not shown in the drawings, the metal block 10 has a number of through holes. In other through holes which are not shown, the contact probes for high frequency signal and contact probes for power supply are arranged coaxially with respect to the metal block 10 in an isolated manner.

An upper face of the retainer 12 which is fixed to the upper face of the metal block 10 is a mounting face on which an electronic component to be inspected is to be mounted. When the electronic component to be inspected is positioned and mounted on this mounting face, a distal end (an upper end) of the contact probe 1 for grounding is brought into contact with an electrode pad for grounding of the electronic component to be inspected. Moreover, the contact probe for high frequency signal and the contact probe for power supply are respectively brought into contact with an electrode pad for high frequency signal and an electrode pad for power supply of the electronic component to be inspected.

In case where the ground tube of the related art which is formed by folding a metal plate into a tubular shape is used, as described above, there are such problems as described below.

(1) Intervals between the electrodes tend to become smaller, as the electronic component to be inspected becomes more and more compact and high integrated. For this reason, the contact probe which is smaller in outer diameter has been requested. Different from the tube of the probe, the ground tube in the related art is produced by folding the metal plate which has been stamped out, and hence, as the diameter becomes smaller, it becomes more difficult to work the metal plate into the tubular shape. Therefore, it becomes difficult to apply the ground tube in the related art to the contact probe for grounding which has the smaller diameter.

(2) The ground tube in the related art is formed by folding the metal plate into the tubular shape, and further, into such a shape that its diameter at the other side is enlarged. Therefore, working cost is high.

(3) The ground tube had better be long, as shown in FIGS. 11(A), 11(B), 11(C), for enabling adequate contact pressure (pressure of contact) against the metal block and the contact probe for grounding to be easily obtained. However, a contact position with respect to the metal block is at an opposite side to a contact position with respect to the contact probe for grounding. As the results, an electrical path from the contact probe for grounding to the metal block grows longer by a length of the ground tube. This structure is unfavorable from a view point of high frequency performance, because in order to obtain favorable high frequency performance, grounding has better be attained at a position close to the electronic component to be inspected. Even though the length of the ground tube is reduced considering the high frequency performance, there occurs such a problem that it becomes difficult to work the ground tube (it becomes difficult to adjust the contact pressure).

(4) When the ground tube in the related art is incorporated into the through hole in the metal block together with the contact probe for grounding, a step for adjusting the inner diameter and so on of the ground tube by means of a pin gauge or the like is required.

SUMMARY

It is therefore an object of the invention to provide an inspection unit having a contact probe for grounding in which a coil spring in a determined shape is used for electrical connection between the contact probe for grounding and a metal block, whereby it is possible to deal with tendency of reducing a diameter of the contact probe for grounding, to reduce production cost, and to omit an adjusting step at a time of assembling.

In order to achieve the object, according to the invention, there is provided an inspection unit comprising:

a metal block having a through hole;

a contact probe for grounding which is coaxially arranged in through hole; and a coil spring having electrical conductivity at least on a surface thereof and provided between an inner peripheral face of the through hole and an outer peripheral face of the contact probe, wherein the coil spring includes:
a first coil part a part of which is in contact with the inner peripheral face of the through hole; and
a second coil part a part of which is in contact with the outer peripheral face of the contact probe.

A diameter of the first coil part may be larger than a diameter of the second coil part, and the first coil part and the second coil part may be eccentric to each other. The part of the first coil part which is in contact with the inner peripheral face of the through hole may be a part of an outer periphery of the first coil part, and an inner periphery of the first coil part may not be in contact with the contact probe. The part of the second coil part which is in contact with the contact probe may be a part of an inner periphery of the second coil part, and an outer periphery of the second coil part may not be in contact with the inner peripheral face of the through hole.

A winding direction of the first coil part may be inclined with respect to a winding direction of the second coil part. The part of the first coil part which is in contact with the inner peripheral face of the through hole may be a part of an outer periphery of the first coil part, and an inner periphery of the first coil part may not be in contact with the contact probe. The part of the second coil part which is in contact with the contact probe may be a part of an inner periphery of the second coil part.

The second coil part may be wound in an elliptical shape. The part of the first coil part which is in contact with the inner peripheral face of the through hole may be a part of an outer periphery of the first coil part, and an inner periphery of the first coil part may not be in contact with the contact probe. The part of the second coil part which is in contact with the contact probe may be a part of an inner periphery of the second coil part.

The coil spring may be wound in an elliptical shape. A longer diameter of an outer periphery of the elliptical shape may be longer than an inner diameter of the through hole, and a shorter diameter of the outer periphery of the elliptical shape may be smaller than the inner diameter of the through hole. The part of the first coil part which is in contact with the inner peripheral face of the through hole may be both side parts of the longer diameter of the outer periphery of the elliptical shape. The part of the second coil part which is in contact with the outer peripheral face of the contact probe may be both side parts of a shorter diameter of an inner periphery of the elliptical shape.

The first coil part and the second coil part respectively may have three windings or more.

The coil spring may be wound in tight fit.

Each of opposite end parts of the coil spring may include the first coil part and the second coil part.

A third coil part and a fourth coil part may be provided in an intermediate part of the coil spring, and the third coil part and the fourth coil part may be eccentric to each other.

BRIEF DESCRIPTION OF THE DRAWINGS

FIGS. 1(A), 1(B) and 1(C) are views showing an inspection unit having a contact probe for grounding in a first embodiment according to the present invention, of which FIG. 1(A) is a sectional view before a coil spring is inserted into a through hole in a metal block, FIG. 1(B) is a sectional view after the coil spring has been inserted into the through hole in the metal block, and FIG. 1(C) is a sectional view after the contact probe for grounding has been inserted.

FIGS. 5(A) and 5(B) show a second embodiment of the invention, of which FIG. 5(A) is a sectional view after the coil spring has been inserted into the through hole in the metal block, and FIG. 5(B) is a sectional view after the contact probe for grounding has been inserted.

FIGS. 6(A) and 6(B) show the second embodiment of the invention, of which FIG. 6(A) is a plan view after the coil spring has been inserted into the through hole in the metal block, and FIG. 6(B) is a plan view after the contact probe for grounding has been inserted.

FIGS. 7(A) and 7(B) show a third embodiment of the invention, of which FIG. 7(A) is a sectional view after the coil spring has been inserted into the through hole in the metal block, and FIG. 7(B) is a sectional view after the contact probe for grounding has been inserted.

FIGS. 8(A) and 8(B) show the third embodiment of the invention, of which FIG. 8(A) is a plan view after the coil spring has been inserted into the through hole in the metal block, and FIG. 8(B) is a plan view after the contact probe for grounding has been inserted.

FIGS. 9(A) and 9(B) show a fourth embodiment of the invention, of which FIG. 9(A) is a sectional view after the coil spring has been inserted into the through hole in the metal block, and FIG. 9(B) is a sectional view after the contact probe for grounding has been inserted.

FIGS. 10(A) and 10(B) show the fourth embodiment of the invention, of which FIG. 10(A) is a plan view after the coil spring has been inserted into the through hole in the metal block, and FIG. 10(B) is a plan view after the contact probe for grounding has been inserted.

FIGS. 11(A), 11(B) and 11(C) show an inspection unit and a ground tube in the related art, of which FIG. 11(A) is a sectional front view showing a part where a contact probe for grounding is mounted, FIG. 11(B) is a sectional front view showing a ground tube too in section, and FIG. 11(C) is a front view of the ground tube which connects the contact probe for grounding to a metal block.

DETAILED DESCRIPTION OF EMBODIMENTS

Figure 1A:
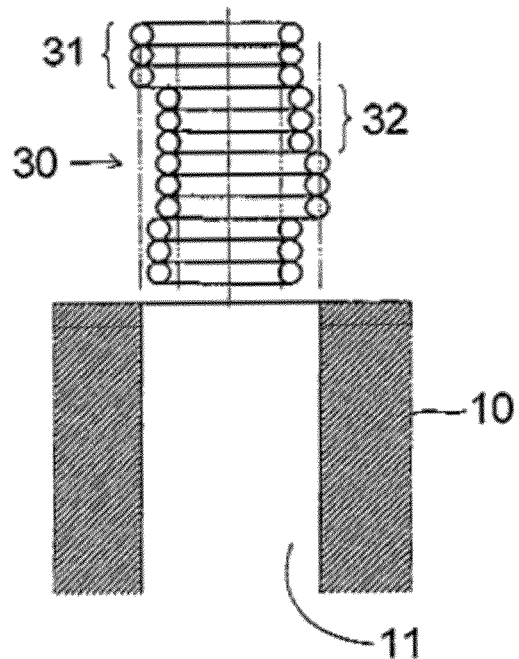

Now, preferred embodiments of the invention will be described in detail, referring to the drawings. It is to be noted that the same or equivalent constituent elements, members, processes which are shown in the drawings are denoted with the same reference numerals, and overlapped descriptions will be omitted. Moreover, the embodiments will not limit the invention, but are only examples, and all features and combinations thereof that are described in the embodiments are not necessarily essential elements of the invention.

Referring to FIG. 1(A) to FIG. 4, an inspection unit having a contact probe for grounding in a first embodiment according to the invention will be described.

A coil spring 30 for achieving electrical connection between a contact probe 1 for grounding and a metal block 10 is formed of electrically conductive metal or resin to which treatment of electrical conductivity has been applied. In short, at least a surface of the coil spring 30 is electrically conductive. This coil spring 30 has a part in which large diameter coil parts 31 as a first coil part, and small diameter coil parts 32 as a second coil part are formed eccentrically to each other in a radial direction. The large diameter coil part 31 is to be connected to an inner wall of a through hole 11 in the metal block 10, and the small diameter coil part 32 having a smaller diameter than the large diameter coil part 31 is to be connected to the contact probe 1 for grounding. Both the large diameter coil part 31 and the small diameter coil part 32 are wound in a circular shape in such a manner that they have a smaller outer diameter than an inner diameter of the through hole 11, and a larger inner diameter than an outer diameter of the contact probe 1 for grounding. When the coil spring 30 is inserted into the through hole 11 and the contact probe 1 for grounding is inserted inside the coil spring 30, contact pressure due to deformation of the coil spring 30 in a radial direction is generated thereby to achieve electrical connection between the contact probe 1 for grounding and the metal block 10.

Figure 3:
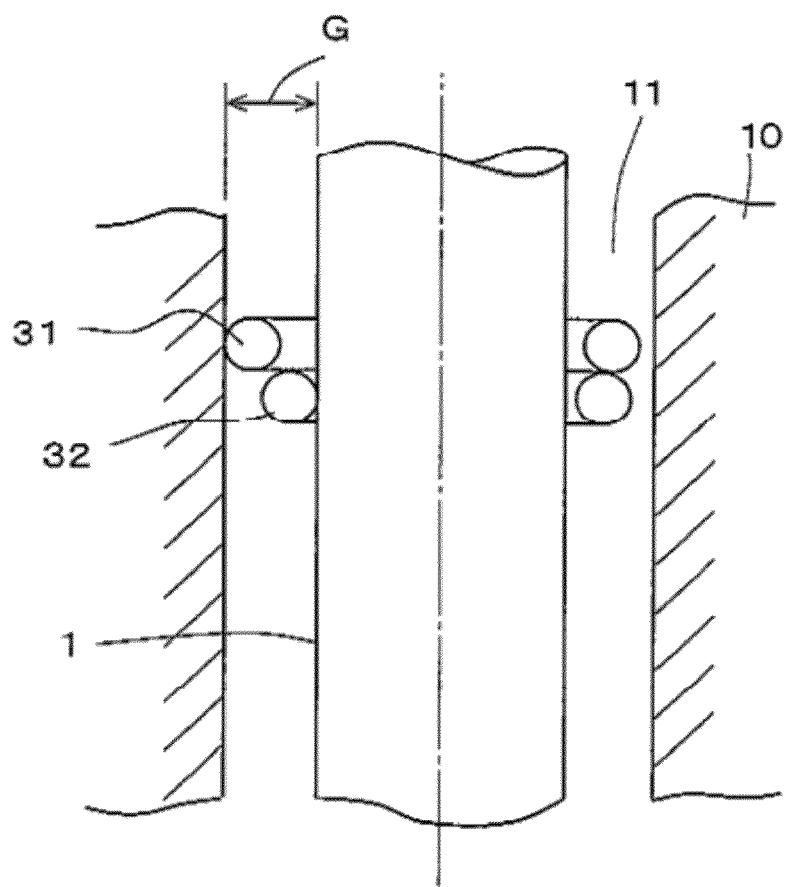
FIG. 3 is an enlarged sectional view for explaining principle of operation of electrical connection between the metal block and the contact probe for grounding by means of the coil spring in the first embodiment.

An amount of relative eccentricity in the radial direction between one of the large diameter coil parts 31 and the small diameter coil part 32 adjacent to the one of the large diameter coil parts 31 is so set that a state as shown in FIG. 3 is established, when the contact probe 1 for grounding is coaxially arranged in the through hole 11 in the metal block 10 (For convenience of explanation, only one winding of the large diameter coil part 31 and only one winding of the small diameter coil part 32 are shown in FIG. 3). Specifically, the amount of eccentricity is such that in a state before the coil spring 30 is inserted into the through hole 11, there occurs a region where a distance between an outer periphery of the large diameter coil part 31 and an inner periphery of the small diameter coil part 32 is larger than a gap G between an outer peripheral face of the contact probe 1 for grounding and an inner peripheral face of the through hole 11. Moreover, in a state where the contact probe 1 for grounding and the coil spring 30 have been inserted and arranged in the through hole 11, a part of the outer periphery of the large diameter coil part 31 is in elastic contact with the inner peripheral face of the through hole 11, and an inner periphery of the large diameter coil part 31 is not in contact with the contact probe 1 for grounding, while a part of the inner periphery of the small diameter coil part 32 is in elastic contact with the outer peripheral face of the contact probe 1 for grounding, and an outer periphery of the small diameter coil part 32 is not in contact with the inner peripheral face of the through hole 11. In this manner, stabilized electrical connection of the coil spring 30 with respect to the metal block 10 and the contact probe 1 for grounding can be achieved.

The large diameter coil part 31 and the small diameter coil part 32 have respectively three windings, which are wound in tight fit and alternately arranged. By alternately arranging the large diameter coil part 31 and the small diameter coil part 32, an electrical path from the contact probe 1 for grounding to the metal block 10 via the coil spring 30 can be shortened to the least. Moreover, by winding the coil spring 30 in tight fit, a distance between a contact position between the large diameter coil part 31 and the inner peripheral face of the through hole 11 and a contact position between the small diameter coil part 32 and the outer peripheral face of the contact probe 1 for grounding can be shortened, whereby the electrical path can be advantageously shortened (An electrical length grows longer, unless the coil spring 30 are wound in tight fit).

The reason why the large diameter coil part 31 and the small diameter coil part 32 have respectively three windings is as follows. Specifically, in case of one winding, there is such possibility that deformation of the coil part in the radial direction would deform the next coil part too, and it is difficult to forecast the deformation in the radial direction and the contact pressure in the radial direction caused by the deformation. Therefore, the number of the windings is set to be three, so that the contact position with respect to the probe and the contact position with respect to the metal block can be as close as possible to each other, while influence of the deformation on the next coil part is reduced to the least.

Figure 1B:
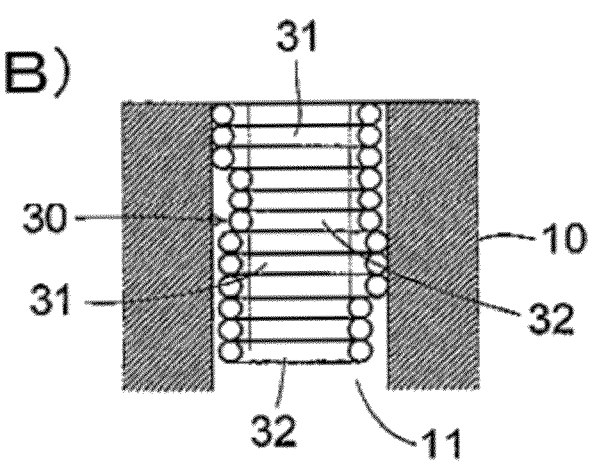
Figure 1C:
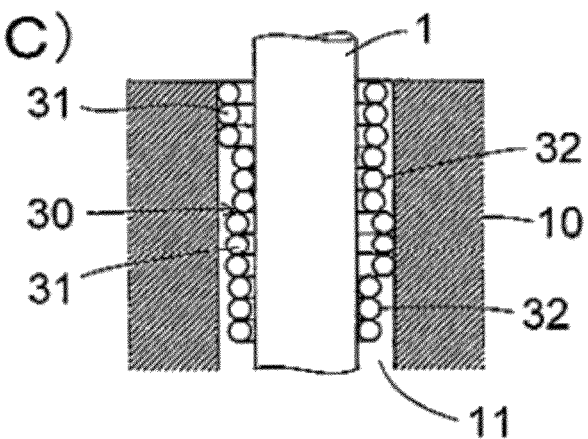
Figure 4:
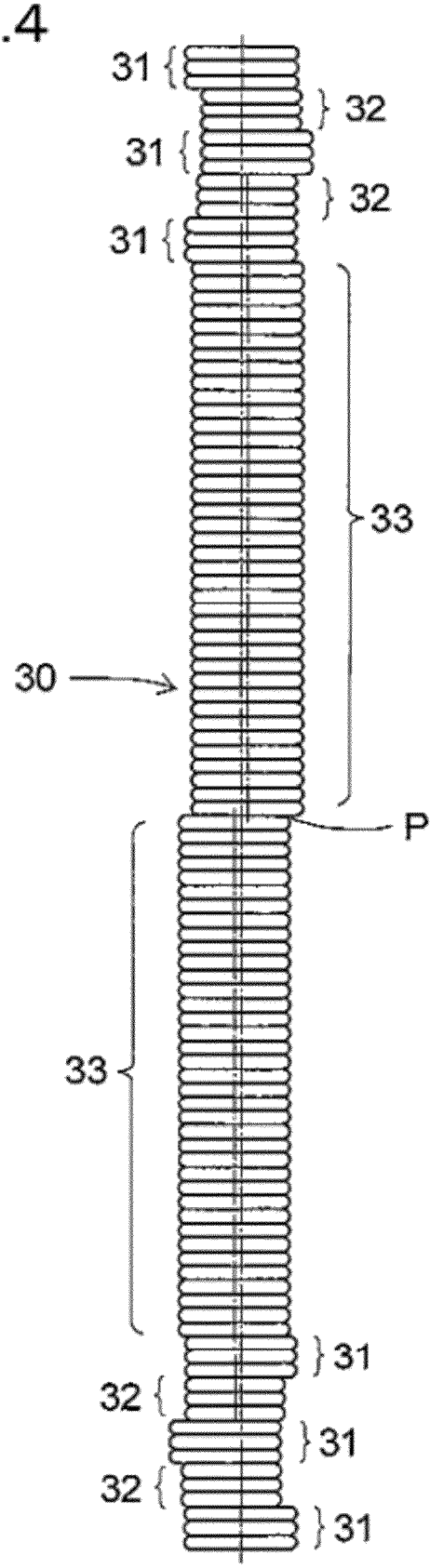
FIG. 4 is a front view showing an entire structure of the coil spring which is used in the first embodiment.
Figure 5A:
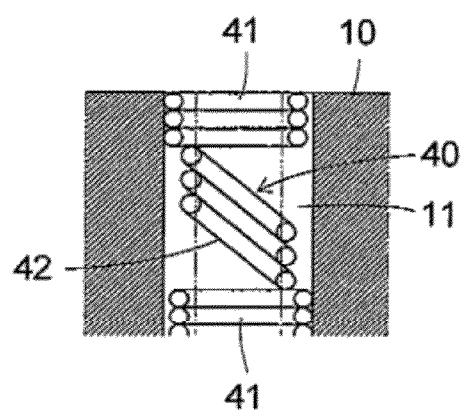
Figure 5B:
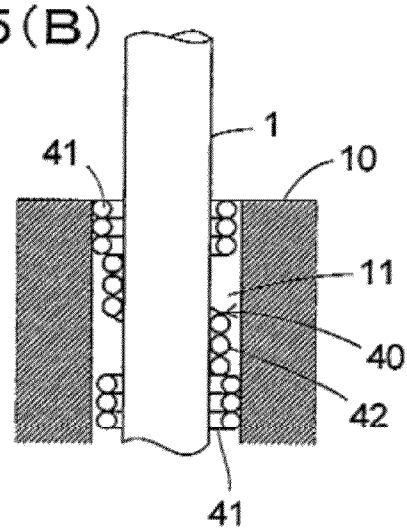
Figure 6A:
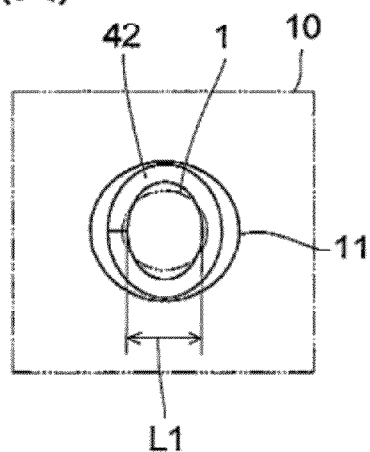
Figure 6B:
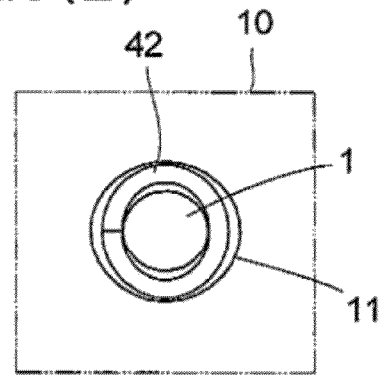
Figure 7A:
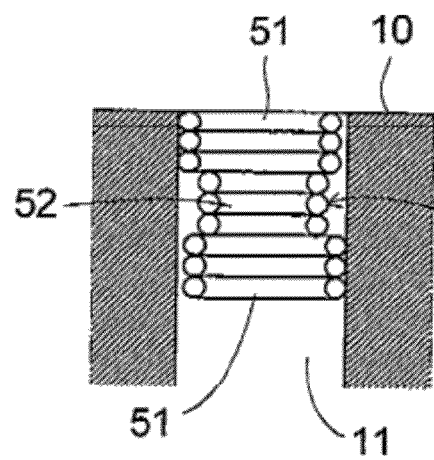
Figure 7B:
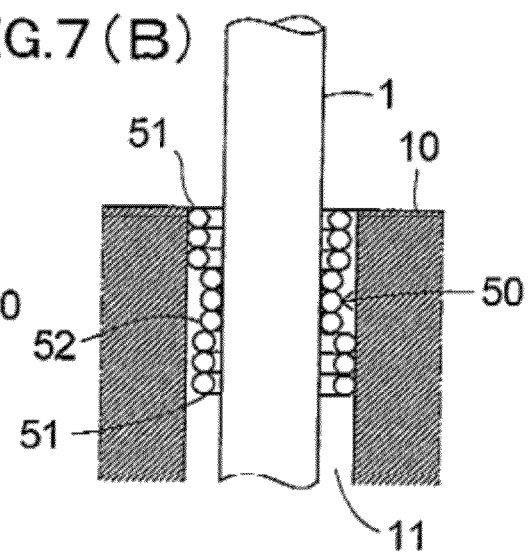
Figure 8A:
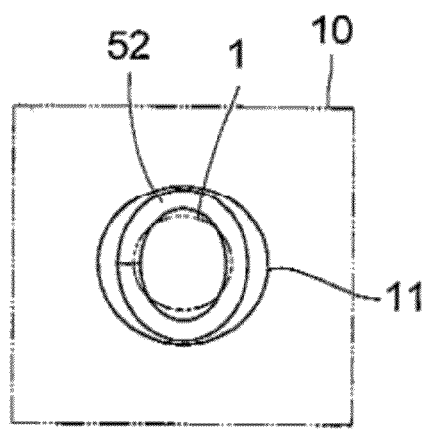
Figure 8B:
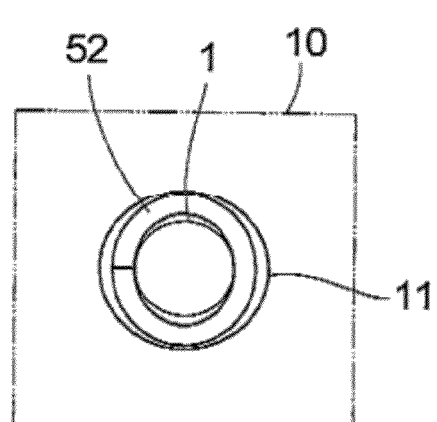
Figure 9A:
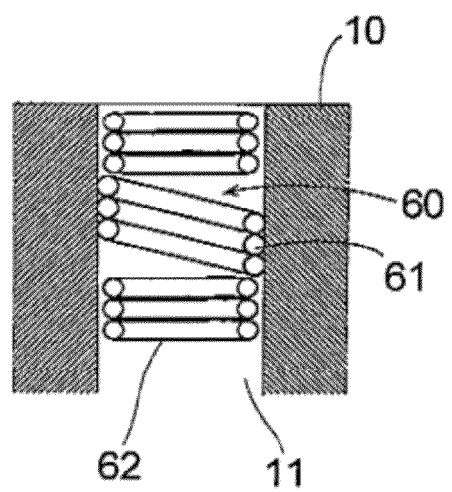
Figure 9B:
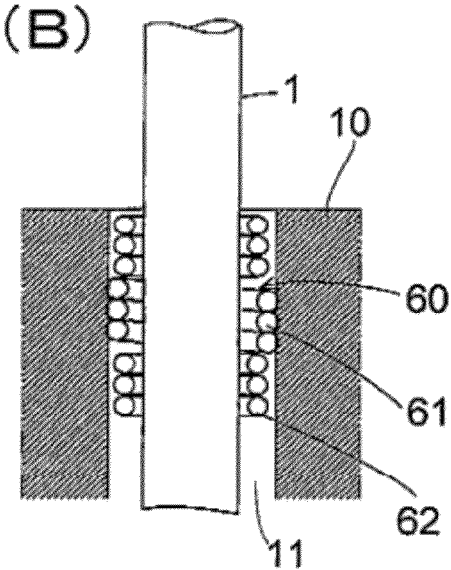
Figure 10A:
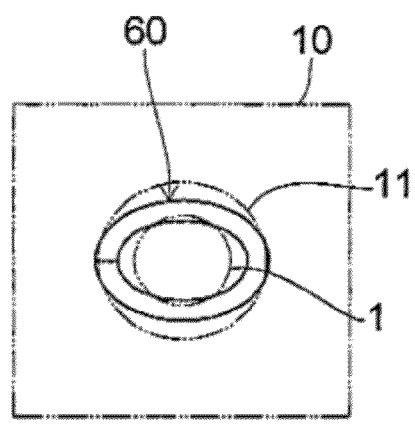
Figure 10B:
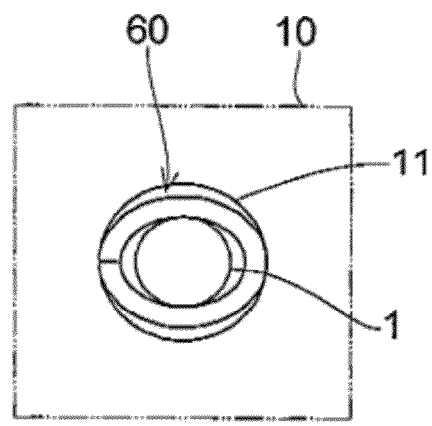

Although only a part of the structure of the coil spring 30 is shown in FIGS. 1(A), 1(B), 1(C), actually, it would be preferable that the coil spring 30 exists along an entire length of the through hole 11, as shown in FIG. 4. Regions where the large diameter coil parts 31 and the small diameter coil parts 32 are alternately formed are provided in opposite end parts of the coil spring 30, as shown in FIG. 4. Moreover, the coil spring 30 has intermediate parts 33 having the same diameter as the large diameter part 31, and formed eccentrically to each other at a position P. This is because the coil spring 30 is to be brought into contact with the inner peripheral face of the through hole 11 in the intermediate parts 33 too. However, it would be sufficient that the diameter of the intermediate parts 33 is smaller than the inner diameter of the through hole 11 and larger than the outer diameter of the contact probe 1 for grounding.

As shown in FIG. 4, the coil spring 30 is wound in tight fit not only in the opposite end parts, but in its entirety. Accordingly, when the coil spring 30 is inserted into the through hole 11 in the metal block 10, the coil spring 30 can be reliably inserted up to a desired position without being compressed. Unless the coil spring 30 is wound in tight fit, it is difficult to reliably insert the coil spring 30 up to the desired position in some cases, because the contact pressure is exerted on the metal block 10 and the contact probe 1 for grounding in the radial direction. Moreover, because the coil spring 30 is wound in tight fit so as to have the same length as the through hole 11, the coil spring 30 scarcely moves inside the metal block 10, and performance can be stabilized. Incase where the coil spring 30 violently moves inside the metal block 10, the electric path from the distal end of the contact probe 1 for grounding to the metal block 10 is varied, and the performance may not be stabilized.

Insertion of the coil spring 30 and the contact probe 1 for grounding into the metal block 10 may be conducted in order of FIGS. 1(A), 1(B) and 1(C) or may be conducted in other inserting orders. The order is not limited.

In the inspection unit having the contact probe for grounding, the contact probe 1 for grounding is coaxially held with respect to the through hole 11 in the metal block 10 by means of retainers (fixing means of insulating substance) which are fixed and arranged on upper and lower faces of the metal block 10, in the same manner as in FIGS. 11(A) and 11(B). Although not shown in the drawings, the metal block 10 has a number of through holes, and in the other through holes which are not shown, contact probes for high frequency signals and contact probes for power supply are arranged coaxially with respect to the metal block 10 in an insulated manner.

According to the embodiment, the following advantages can be attained.

(1) The inspection unit according to the invention can deal with the tendency of reducing the diameter of the contact probe 1 for grounding, because the coil spring 30 having the desired shape which is electrically conductive at least on its surface is used in place of the ground tube which is formed by folding the metal plate into a tubular shape in the related art. In case of producing the ground tube by folding the metal plate as in the related art, the contact probe for grounding having the inner diameter of 0.2 mm is a limit to be produced at a level of mass production. However, in case of using the coil spring, the contact probe for grounding having the inner diameter of up to 0.05 mm can be produced.

(2) As compared with the case of producing the ground tube by folding the metal plate as in the related art, the production cost can be reduced, and the contact probe for grounding can be produced at a cost less than a half.

(3) By managing the shape of the coil spring 30 (the large diameter coil part 31 as the first coil part, the small diameter coil part 32 as the second coil part, and the amount of eccentricity between them) at a stage of designing and producing the coil spring 30, necessity of the adjusting step at a time of incorporating the coil spring 30 into the metal block 10 can be eliminated.

(4) In the coil spring 30, the large diameter coil part 31 and the small diameter coil part 32 are alternately formed, and therefore, the electrical path from the contact probe 1 for grounding to the metal block 10 via the coil spring 30 can be shortened to the least.

(5) In the coil spring 30, the large diameter coil part 31 and the small diameter coil part 32 respectively have the three windings, and therefore, the large diameter coil part 31 to be contacted with the metal block 10 can be made as close as possible to the small diameter coil part 32 to be contacted with the contact probe for grounding, while influence of the deformation in the radial direction on the next coil part is decreased to the least.

(6) The coil spring 30 is wound in tight fit in its entirety including the large diameter coil part 31 and the small diameter coil part 32. Because the large diameter coil part 31 and the small diameter coil part 32 are wound in tight fit, a distance between the contact position of the large diameter coil part 31 with respect to the inner peripheral face of the through hole 11 and the contact position of the small diameter coil part 32 with respect to the outer peripheral face of the contact probe 1 for grounding can be shortened, and the electrical path can be advantageously shortened (Unless the coil spring 30 is wound in tight fit, the electrical distance grows longer). Moreover, the coil spring 30 can be reliably inserted up to the desired position, when the coil spring 30 is inserted into the through hole 11 in the metal block 10. By winding the coil spring 30 in tight fit so as to have the same length as the though hole 11, the coil spring 30 scarcely moves inside the metal block 10, and the performance can be stabilized.

(7) Because those regions where the large diameter coil part 31 and the small diameter coil part 32 are eccentric to each other are formed in the opposite end parts of the coil spring 30, directivity is lost. Therefore, there is no necessity of confirming the directivity of the coil spring 30 when the coil spring 30 is assembled, and assembling workability is enhanced. By the way, in order to obtain favorable high frequency performance, grounding connection had better be conducted at a position near the electronic component to be inspected, that is, at a position near the distal end of the contact probe 1 for grounding. By providing those regions where the large diameter coil part 31 and the small diameter coil part 32 are eccentric to each other in the opposite end parts of the coil spring 30, the grounding connection can be made at the position near the distal end of the contact probe 1 for grounding, and favorable high frequency performance can be secured.

Referring to FIG. 5(A) to FIG. 6(B), a second embodiment of the invention will be described.

A coil spring 40 for achieving electrical connection between the contact probe 1 for grounding and the metal block 10 is formed of electrically conductive metal or resin to which treatment of electrical conductivity has been applied. In short, at least a surface of the coil spring 40 is electrically conductive. This coil spring 40 has a region in which a first coil part 41 to be connected to the inner wall of the through hole 11, and a second coil part 42 to be connected to the contact probe 1 for grounding are alternately formed. Both the first coil part 41 and the second coil part 42 are wound in a circular shape so that they have the outer diameter smaller than the inner diameter of the though hole in the metal block 10, and the inner diameter larger than the outer diameter of the contact probe 1 for grounding, except that a winding face of the first coil part 41 is substantially perpendicular to an axial direction of the coil spring 40, while a winding face (winding direction) of the second coil part 42 is inclined with respect to the first coil spring 41 (For example, in the embodiment as shown in the drawings, the winding direction is inclined substantially at 45 degree). According to this inclination, in FIG. 6(A) as seen from above along the center axis of the through hole 11, a length L1 of an inside space of the second coil part 42 at a narrower side is set to be smaller than the outer diameter of the contact probe 1 for grounding. Moreover, the first coil part 41 and the second coil part 42 are eccentric to each other in a radial direction.

In this case, when the coil spring 40 is inserted into the through hole 11 and the contact probe 1 for grounding is inserted inside the coil spring 40, the second coil part 42 which is inclined in the winding direction is deformed thereby to allow the contact probe 1 for grounding to be inserted, and contact pressure is generated, whereby stabilized electrical connection is achieved. Moreover, when the first coil part 41 which is eccentric to the second coil part 42 is deformed in a radial direction, contact pressure against the inner wall of the through hole 11 is generated, whereby stabilized electrical connection is achieved. On this occasion, a part of an outer periphery of the first coil part 41 is in elastic contact with the inner peripheral face of the through hole 11 while an inner periphery of the first coil part 41 is not in contact with the contact probe 1 for grounding, and a part of an inner periphery of the second coil part 42 is in elastic contact with the outer peripheral face of the contact probe 1 for grounding, while an outer periphery of the second coil part 42 is not in contact with the inner peripheral face of the through hole 11. However, there is such a case that a center axis of the second coil part 42 is displaced with respect to the contact probe 1 for grounding, and the outer periphery of the second coil part 42 is partially contacted with the inner peripheral face of the through hole 11.

The first coil part 41 and the second coil part 42 have respectively three windings, which are wound in tight fit and alternately arranged. By alternately arranging the first coil part 41 and the second coil part 42, an electrical path from the contact probe 1 for grounding to the metal block 10 via the coil spring 40 can be shortened to the least.

The first coil part 41 and the second coil part 42 respectively have the three windings for the same reasons as described in the first embodiment.

Although only a part of the structure of the coil spring 40 is shown in FIGS. 5(A), 5(B) and FIGS. 6(A), 6(B), actually, it would be preferable that the coil spring 40 exists along the entire length of the through hole 11. On this occasion, regions where the first coil part 41 and the second coil part 42 are alternately formed are provided in opposite end parts of the coil spring 40. Moreover, the coil spring 40 may have intermediate parts having the same diameter as the first coil part 41, and a position where the intermediate parts are eccentric to each other may exist, in the same manner as in FIG. 4.

Advantages of this second embodiment are substantially the same as those of the first embodiment.

Referring to FIG. 7(A) to FIG. 8(B), a third embodiment of the invention will be described.

A coil spring 50 for achieving electrical connection between the contact probe 1 for grounding and the metal block 10 is formed of electrically conductive metal or resin to which treatment of electrical conductivity has been applied. In short, at least a surface of the coil spring 50 is electrically conductive. This coil spring 50 has a region in which a first coil part 51 to be connected to the inner wall of the through hole 11, and a second coil part 52 to be connected to the contact probe 1 for grounding are alternately formed.

The first coil part 51 is wound in a circular shape in such a manner that it has an outer diameter smaller than the inner diameter of the though hole 11, and an inner diameter larger than the outer diameter of the contact probe 1 for grounding. The second coil part 52 is wound in an elliptical shape, and a longer diameter of an outer periphery of the elliptical shape (an outer diameter in a direction of a longer axis) is smaller than the inner diameter of the through hole 11, and a longer diameter of an inner periphery of the elliptical shape (an inner diameter in a direction of a longer axis) is larger than the outer diameter of the contact probe 1 for grounding, and a shorter diameter of an inner periphery of the elliptical shape (an inner diameter in a direction of a shorter axis) is smaller than the outer diameter of the contact probe 1 for grounding. Moreover, the first coil part 51 and the second coil part 52 are eccentric to each other in a radial direction.

In this case, when the coil spring 50 is inserted into the through hole 11 and the contact probe 1 for grounding is inserted inside the coil spring 50, a part of the second coil part 52 wound in the elliptical shape, which is narrower than the contact probe 1 for grounding, is deformed so as to be enlarged, thereby to allow the contact probe 1 for grounding to be inserted, and at the same time, contact pressure is generated, whereby stabilized electrical connection is achieved. Moreover, when the first coil part 51 which is eccentric to the second coil part 52 is deformed in a radial direction, contact pressure against the inner wall of the through hole 11 is generated, whereby stabilized electrical connection is achieved. On this occasion, a part of an outer periphery of the first coil part 51 is in elastic contact with the inner peripheral face of the through hole 11, while an inner periphery of the first coil part 51 is not in contact with the contact probe 1 for grounding, and a part of an inner periphery of the second coil part 52 is in elastic contact with the outer peripheral face of the contact probe 1 for grounding, while an outer periphery of the second coil part 52 is not in contact with the inner peripheral face of the through hole 11. However, there is such a case that a center axis of the second coil part 52 is displaced with respect to the contact probe 1 for grounding, and the outer periphery of the second coil part 52 is partially contacted with the inner peripheral face of the through hole 11.

The first coil part 51 and the second coil part 52 respectively have three windings, which are wound in tight fit and alternately arranged. By alternately arranging the first coil part 51 and the second coil part 52, an electrical path from the contact probe 1 for grounding to the metal block 10 via the coil spring 50 can be shortened to the least.

The first coil part 51 and the second coil part 52 respectively have the three windings for the same reasons as described in the first embodiment.

Although only a part of the structure of the coil spring 50 is shown in FIGS. 7(A), 7(B) and FIGS. 8(A), 8(B), actually, it would be preferable that the coil spring 50 exists along the entire length of the through hole 11. On this occasion, regions where the first coil part 51 and the second coil part 52 are alternately formed are provided in opposite end parts of the coil spring 50. Moreover, the coil spring 50 may have intermediate parts having the same diameter as the first coil part 51, and a position where the intermediate parts are eccentric to each other may exist in the same manner as in FIG. 4.

Advantages of this third embodiment are substantially the same as those of the first embodiment.

Referring to FIG. 9(A) to FIG. 10(B), a fourth embodiment of the invention will be described.

A coil spring 60 for achieving electrical connection between the contact probe 1 for grounding and the metal block 10 is formed of electrically conductive metal or resin to which treatment of electrical conductivity has been applied, and at least a surface of the coil spring 60 is electrically conductive. A coil part 61 which is a part of this coil spring 60 is wound in tight fit in an elliptical shape, and a longer axis in a winding face (winding direction) thereof is inclined with respect a plane which is perpendicular to an axial direction of the coil spring 60 (at a few degree to 45 degree, for example). A longer diameter of an outer periphery of the elliptical shape of the coil part 61 in the elliptical shape is larger than the inner diameter of the through hole 11 in the metal block 10, and a shorter diameter of the outer periphery of the elliptical shape is smaller than the inner diameter of the through hole 11, while a longer diameter of an inner periphery of the elliptical shape is larger than the outer diameter of the contact probe 1 for grounding, and a shorter diameter of the inner periphery of the elliptical shape is smaller than the outer diameter of the contact probe 1 for grounding. Moreover, coil parts 62 in a circular shape which are wound in a circular shape are provided at both sides of the coil part 61 in the elliptical shape, and it would be sufficient that a diameter of the coil part 62 may be smaller than the inner diameter of the through hole 11 and larger than the outer diameter of the contact probe 1 for grounding.

In this case, when the coil spring 60 is inserted into the through hole 11, contact pressure is generated due to deformation of the coil part 61 in the elliptical shape in an inclining direction of the longer axis of the elliptical shape, and stabilized electrical connection between the coil spring 60 and the through hole 11 is performed. When the contact probe 1 for grounding is inserted inside the coil spring 60, the elliptical shape of the coil part 61 is enlarged in a direction of the shorter axis, whereby contact pressure is generated, and stabilized electrical connection between the coil spring 60 and the contact probe 1 for grounding is performed. On this occasion, both side parts of the shorter diameter of an inner periphery of the elliptical shape of the coil part 61 come into elastic contact with the outer peripheral face of the contact probe 1 for grounding, and both side parts of the longer diameter of an outer periphery of the elliptical shape of the coil spring 60 come into elastic contact with the inner peripheral face of the through hole.

According to this fourth embodiment, because the coil spring 60 is used for electrical connection between the contact probe 1 for grounding and the metal block 10, it is possible to deal with the tendency of reducing the diameter of the contact probe 1 for grounding, and to obtain an advantage of reducing the production cost.

Moreover, by managing the shape of the coil spring 60 at a stage of designing and producing it, necessity of an adjusting step at a time of incorporating the coil spring 60 into the metal block 10 can be eliminated.

Further, the electrical path from the contact probe 1 for grounding to the metal block 10 via the coil spring 60 can be shortened to the least.

Because the coil spring 60 is wound in tight fit, the coil spring 60 can be easily inserted into the through hole 11 in the metal block 10, and movement of the coil, spring 60 inside the through hole 11 can be prevented, and hence, stabilization of the performance can be attained.

Although the invention has been described by way of examples referring to the embodiments, it is to be understood by those skilled in the art that various modifications can be made within a scope of the claims, concerning the respective constituent elements and treating processes in the embodiments. The modifications will be described below.

In the first, second and third embodiments, a case where the first coil part and the second coil part of the coil spring respectively have the three windings is shown. However, the coil parts respectively having four windings can be also used, and in this case too, influence of the deformation on the coil part due to a change in diameter (or a shape of winding) between the first coil part and the second coil part can be decreased to the least, and the contact pressure (against the metal block 10 and the contact probe 1 for grounding) can be easily forecasted.

Figure 2:
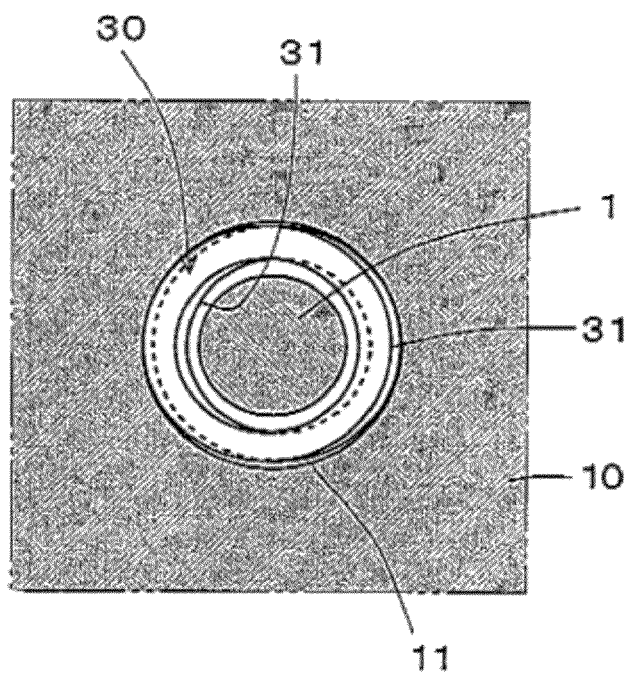
FIG. 2 is a plan view showing the coil spring and the contact probe for grounding in the first embodiment after the coil spring and the contact probe for grounding have been inserted, in a state where a first coil part and a second coil part from above are eccentric in two directions.

In the first, second and third embodiments, the coil parts of the coil spring are made eccentric in two directions at 180 degree, for example, as seen from a center of the through hole in the metal block, as shown in FIG. 2. However, the coil parts may be made eccentric in three directions, at 120 degree, or in four directions, at 90 degree.

According to the inspection unit having the contact probe for grounding in this invention, the coil spring in a determined shape having electrical conductivity at least on the surface thereof is used in place of the ground tube in the related art which is formed by folding the metal plate into a tubular shape. Therefore, it is possible to deal with the tendency of reducing the diameter of the contact probe for grounding, and to reduce the production cost. Moreover, by managing the shape of the coil spring at the stage of designing and producing it, necessity of the adjusting step at a time of incorporating the coil spring into the metal block can be eliminated.

What is claimed is:

1. An inspection unit comprising:
   a metal block having a through hole;
   a contact probe for grounding which is coaxially arranged in the through hole a; and
   a coil spring having electrical conductivity at least on a surface thereof and provided between an inner peripheral face of the through hole and an outer peripheral face of the contact probe,
   wherein the coil spring includes:
       a first coil part a part of which is in contact with the inner peripheral face of the through hole;
       a second coil part a part of which is in contact with the outer peripheral face of the contact probe; and
       the metal block and the contact probe are free of contacting each other but electrically conducted via the coil spring.

2. The inspection unit according to claim 1, wherein
   a diameter of the first coil part is larger than a diameter of the second coil part, and the first coil part and the second coil part are eccentric to each other,
   the part of the first coil part which is in contact with the inner peripheral face of the through hole is a part of an outer periphery of the first coil part, and an inner periphery of the first coil part is not in contact with the contact probe, and
   the part of the second coil part which is in contact with the contact probe is a part of an inner periphery of the second coil part, and an outer periphery of the second coil part is not in contact with the inner peripheral face of the through hole.

3. The inspection unit according to claim 1, wherein
   a winding direction of the first coil part is inclined with respect to a winding direction of the second coil part,
   the part of the first coil part which is in contact with the inner peripheral face of the through hole is a part of an outer periphery of the first coil part, and an inner periphery of the first coil part is not in contact with the contact probe, and
   the part of the second coil part which is in contact with the contact probe is a part of an inner periphery of the second coil part.

4. The inspection unit according to claim 1, wherein
   the second coil part is wound in an elliptical shape,
   the part of the first coil part which is in contact with the inner peripheral face of the through hole is a part of an outer periphery of the first coil part, and an inner periphery of the first coil part is not in contact with the contact probe, and
   the part of the second coil part which is in contact with the contact probe is a part of an inner periphery of the second coil part.

5. The inspection unit according to claim 1, wherein
   the coil spring is wound in an elliptical shape, a longer diameter of an outer periphery of the elliptical shape is longer than an inner diameter of the through hole, and a shorter diameter of the outer periphery of the elliptical shape is smaller than the inner diameter of the through hole,
   the part of the first coil part which is in contact with the inner peripheral face of the through hole is both side parts of the longer diameter of the outer periphery of the elliptical shape, and
   the part of the second coil part which is in contact with the outer peripheral face of the contact probe is both side parts of a shorter diameter of an inner periphery of the elliptical shape.

6. The inspection unit according to claim 1, wherein the first coil part and the second coil part respectively have three windings or more.

7. The inspection unit according to claim 1, wherein the coil spring is wound in tight fit.

8. The inspection unit according to claim 1, wherein each of opposite end parts of the coil spring includes the first coil part and the second coil part.

9. The inspection unit according to claim 8, wherein a third coil part and a fourth coil part are provided in an intermediate part of the coil spring, and the third coil part and the fourth coil part are eccentric to each other.

10. The inspection unit according to claim 1, wherein the contact probe exists along an entire length of the through hole.

* * * * *